US011047909B2

(12) United States Patent
Kukreja et al.

(10) Patent No.: US 11,047,909 B2
(45) Date of Patent: Jun. 29, 2021

(54) INTER-DOMAIN POWER ELEMENT TESTING USING SCAN

(71) Applicant: MaxLinear, Inc., Carlsbad, CA (US)

(72) Inventors: Himanshu Kukreja, Bangalore (IN); Shakil Ahmad, Singapore (SG)

(73) Assignee: MaxLinear, Inc., Carlsbad, CA (US)

(*) Notice: Subject to any disclaimer, the term of this patent is extended or adjusted under 35 U.S.C. 154(b) by 141 days.

(21) Appl. No.: 16/281,203

(22) Filed: Feb. 21, 2019

(65) Prior Publication Data
US 2020/0132762 A1 Apr. 30, 2020

(51) Int. Cl.
*G01R 31/317* (2006.01)
*G01R 31/3177* (2006.01)

(52) U.S. Cl.
CPC ... *G01R 31/31721* (2013.01); *G01R 31/3177* (2013.01); *G01R 31/31712* (2013.01)

(58) Field of Classification Search
None
See application file for complete search history.

(56) References Cited

U.S. PATENT DOCUMENTS

| | | | | |
|---|---|---|---|---|
| 7,870,449 B2 * | 1/2011 | Waayers | ........ | G01R 31/318555 714/727 |
| 8,032,806 B1 * | 10/2011 | Tabatabaei | ..... | G01R 31/318572 714/727 |
| 8,302,065 B2 * | 10/2012 | Shomrony | ..... | G01R 31/318555 716/136 |
| 8,531,204 B2 * | 9/2013 | Meijer | ........... | G01R 31/318508 326/16 |
| 8,689,068 B2 * | 4/2014 | Jain | ................ | G01R 31/318575 714/729 |
| 9,568,551 B1 * | 2/2017 | Kataria | ........... | G01R 31/31727 |
| 10,032,723 B2 * | 7/2018 | Tammanur Ranganathan ............ H01L 23/544 |
| 10,310,013 B2 * | 6/2019 | Ge | .................... | G01R 31/31721 |
| 2002/0184582 A1 * | 12/2002 | Pouya | ............ | G01R 31/318547 714/726 |
| 2005/0055615 A1 * | 3/2005 | Agashe | .......... | G01R 31/318552 714/727 |
| 2008/0265906 A1 * | 10/2008 | Waayers | .......... | G01R 31/31919 324/537 |
| 2011/0221502 A1 * | 9/2011 | Meijer | ........... | G01R 31/318508 327/333 |
| 2013/0117618 A1 * | 5/2013 | Kukreja | ......... | G01R 31/318541 714/726 |

* cited by examiner

*Primary Examiner* — Jermele M Hollington
(74) *Attorney, Agent, or Firm* — Maschoff Brennan

(57) ABSTRACT

Systems, methods, and circuitries are disclosed to test an inter-domain device that is positioned in a signal path between a first output wrapper device in a first module and a first input wrapper device in a second module. In one example, a testing system includes an output scan chain that includes the first output wrapper device and an input scan chain that includes the first input wrapper device. A controller is configured to: provide an output scan enable signal to the output scan chain to cause test data to be stored in the first output wrapper device; capture, with the first input wrapper device, inter-domain device data output; provide an input scan enable signal to the input scan chain to cause the inter-domain device data to be output by an output scan chain serial output; and determine whether the inter-domain device data indicates that the inter-domain device is defective.

20 Claims, 6 Drawing Sheets ies**

INTER-DOMAIN POWER ELEMENT TESTING USING SCAN

CROSS REFERENCE TO RELATED APPLICATIONS

This application claims the benefit of priority to Indian Patent Application Number 201841040970 filed on Oct. 30, 2018, entitled "INTER-DOMAIN POWER ELEMENT TESTING USING SCAN", which is incorporated herein by reference for all purposes.

BACKGROUND

Current system-on-chip (SOC) designs include multiple power domains which might operate at different voltages and/or be selectively powered down to conserve power. Each power domain may include one or more modules (i.e., sets of devices and/or circuitry) that cooperate to perform a set of functions for the SOC. During SOC operation, signals are passed between the modules, which may be in different power domains. To account for the different voltages amongst the power domains, level shifter devices in receiving modules level shift signals crossing power domains into the voltage domain of the receiving module. Isolation cell devices in receiving modules protect the receiving module from errors or damage that may be caused due to floating input values when the receiving module is ON while modules that provide input to the receiving module are OFF.

DESCRIPTION

Figure 1:
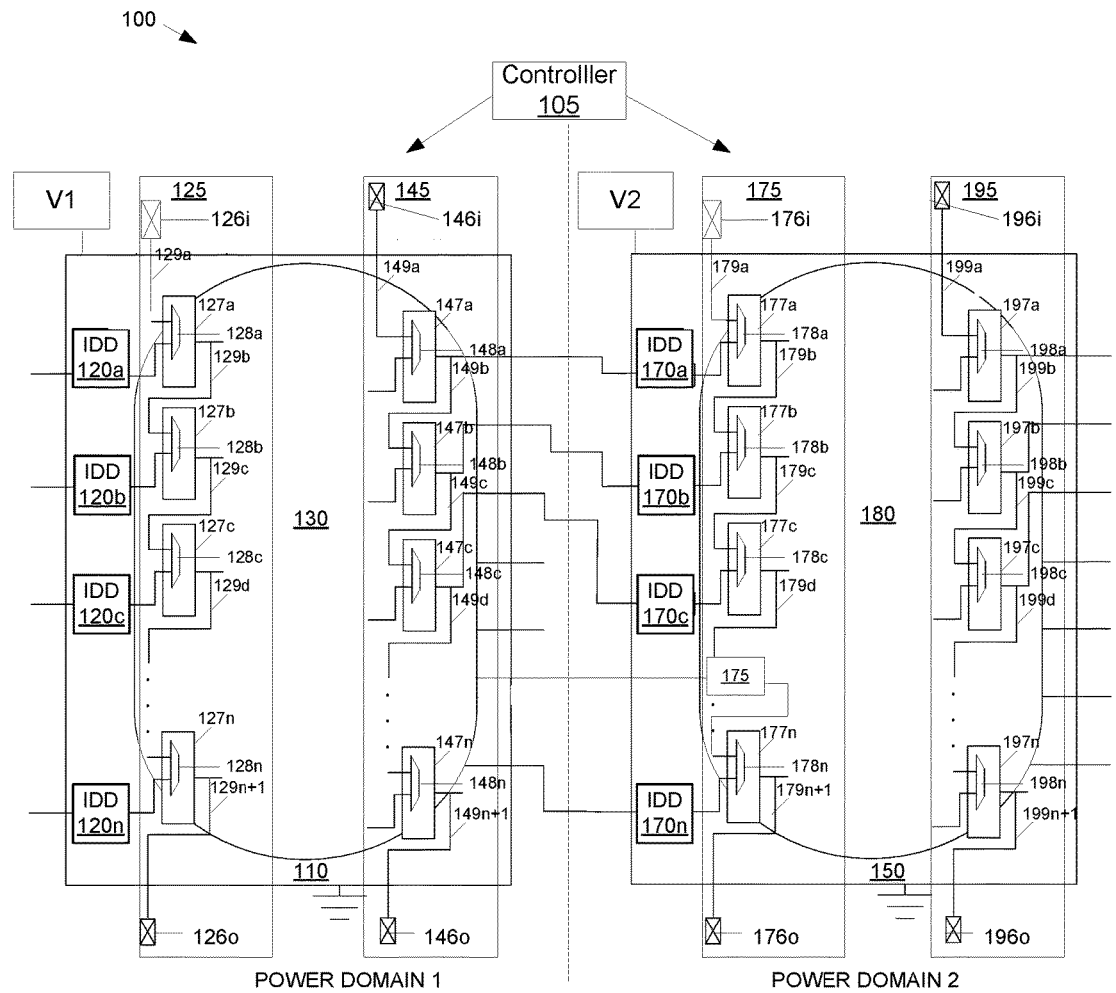
FIG. 1 illustrates an exemplary inter-domain device testing system in accordance with various aspects described.

Modern SOCs include multiple power domains and many modules. For the purposes of this description an individual "power domain" includes a set of one or more modules that operate in a same voltage domain and/or a set of one or more modules that are powered ON or OFF together as part of a power management strategy. To support multiple power domains, SOCs include thousands of isolation cells and level shifters that are deployed in receiving modules in each power domain. For the purposes of this description, the term "inter-domain device" means any device or element that processes a power domain crossing signal or data upon the signal's entry into a receiving module. Level shifters and isolation cells are two examples of inter-domain devices, however, other devices may be considered as inter-domain devices and benefit from the testing methods, systems, and circuitries that will described herein.

Up to now it has not been feasible to test the thousands of inter-domain devices which are embedded inside an SOC due to the difficulty in accessing these devices. Described herein are systems, circuitries, and methods that efficiently test inter-domain devices, which will improve the outgoing quality of SOCs.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer-readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer-readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates an exemplary inter-domain device testing system 100 configured to test inter-domain devices that lie on signal paths between modules in an SOC with multiple power domains. The first module 110 includes logic devices 130 that cooperate to perform some set of functions for the SOC. The logic devices 130 include input "wrapper" devices 127a-127n and output "wrapper" devices 147a-147n that surround or form a periphery of the remaining logic devices. The second module 150 includes logic devices 180 that cooperate to perform some set of functions for the SOC. The logic devices 180 include input "wrapper" devices 177a-177n and output "wrapper" devices 197a-197n that surround or form a periphery of the remaining logic devices. For the purposes of this description an input "wrapper" device is any sequential element or device that is the first device that stores an incoming domain crossing signal on a module while an output "wrapper" device is the final sequential element or device that stores an outgoing domain crossing signal on a module. Examples of wrapper devices include flip-flops, flops, and registers.

The testing system 100 includes a controller 105, a first input scan chain 125 and a first output scan chain 145 on the first module 110, and a second input scan chain 175 and a second output scan chain 195 on the second module. In one example, in order to construct each scan chain, pins of modules that have an inter-domain device (e.g., level shifter, isolation cell, and so on) in the unified power format (UPF) specification are identified. The fanout of each of the identified pins is determined and a sequential element (e.g., flip-flop or register) nearest the pin is identified as either an input or output wrapper device depending on the pin. For any input pins that receive a signal from an inter-domain device but do not have a sequential element that receives the inter-domain device signal, a dedicated wrapper device 175 that receives the inter-domain device signal may be added to the logic 180.

The identified wrapper devices are grouped into an input chain for wrapper devices that receive a signal from an inter-domain device and an output chain for wrapper devices that transmit a signal to an inter-domain device. The chain wrapper devices are "stitched together" by providing a connection path 129a-129n+1, 149a-149n+1, 179a-179n+1, 199a-199n+1 between adjacent wrapper devices in the chain. A multiplexor 128a-128n, 148a-148n, 178a-178n, 198a-198n is connected at an input to the wrapper devices to allow for each wrapper device to either receive a data signal during normal operation or receive test data shifted into the wrapper device from an adjacent wrapper device during test operation. In this manner, the wrapper devices in a scan chain are selectively serially connected to an adjacent wrapper device.

Each scan chain includes a scan chain serial input 126i, 146i, 176i, 196i that is configured to input test data bits serially to a "top" wrapper device in the scan chain. Each scan chain includes a scan chain serial output 126o, 146o, 176o, 196o that is configured to output a captured data bit value stored in a "bottom" wrapper device and in this manner serially output inter-domain device data bits stored in the wrapped devices in the scan chain during device testing.

During inter-domain device testing of inter-domain devices 170a-170n, in response to a test mode signal the controller 105 is configured to provide an output scan enable signal to the output scan chain 145 to cause test data to be shifted into the output scan chain serial input 146i and stored in the wrapper devices of first output scan chain 145. In one example, the output scan enable signal is a selection signal for the multiplexors 148a-148n that causes the input to the wrapper devices 147a-147n to be the connections 149a-149n+1. The test data is input into the wrapper devices in the output scan chain 145.

The controller 105 then captures, with the input wrapper devices 177a-177n, inter-domain device data that is output by the inter-domain devices 170a-170n. In order to capture the inter-domain device data, the controller has a clock signal output that can selectively trigger the output scan chain wrapper elements 147a-147n to shift their stored data to the inter-domain devices 170a-170n and also trigger the inter-domain devices to process the data from the output scan chain wrapper elements. The inter-domain device data output by the inter-domain devices is received by the input scan chain wrapper devices 177a-177n (which are not yet scan enabled).

The controller 105 provides an input scan enable signal to the input scan chain to cause the inter-domain device data to be shifted through the output scan chain 175 and output by the output scan chain serial output 176o. The controller determines whether the inter-domain device data indicates that the inter-domain device is defective. For example, when the inter-domain device is a level shifter, a magnitude of a "1" value in the data output by the input scan chain 175 may be compared to a proper voltage domain value. In response to determining that the inter-domain device is defective, the controller provides a defect signal that indicates that an inter-domain device is defective.

Figures 2A, 2B:
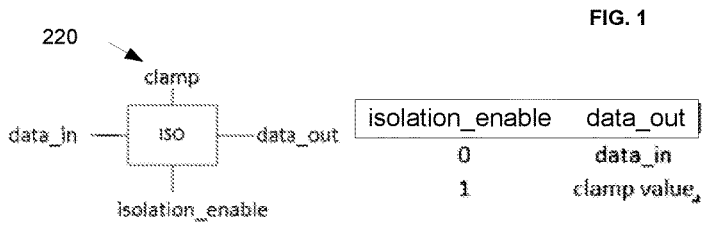
FIG. 2A illustrates an exemplary isolation cell inter-domain device in accordance with various aspects described.
FIG. 2B illustrates an exemplary truth table for the isolation cell of FIG. 2A.

FIG. 2A illustrates an example isolation cell 220. Recall that an isolation cell is one example of an inter-domain device (e.g., 120a-120n, 170a-170n of FIG. 1). The isolation cell 220 has two inputs, a data_in input and a clamp input. The clamp input is tied to a predetermined clamp value, usually a logical 1 or 0. The isolation cell 220 can be enabled or disabled by an isolation_enable signal. As shown in FIG. 2B, when the isolation_enable signal is a 0, the isolation cell is "disabled" and the data_in value is output by the data_out output of the isolation cell. When the isolation_enable signal is 1, the isolation cell is "enabled" and the clamp value is output by the data_out output of the isolation cell.

Figure 3:
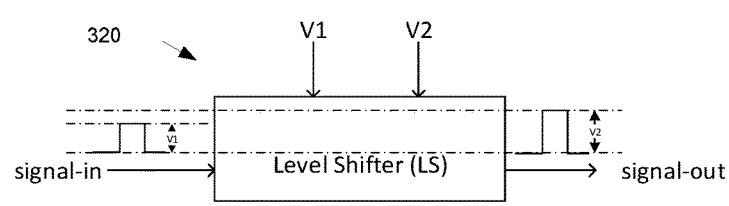
FIG. 3 illustrates an exemplary level shifter inter-domain device in accordance with various aspects described.

FIG. 3 illustrates an example level shifter 320. Recall that level shifter is one example of an inter-domain device (e.g., 120a-120n, 170a-170n of FIG. 1). The basic function of a level shifter is to receive a signal at one voltage level V1 and transmit a logically equivalent signal at another voltage level V2. For example, if a logical value of 1 has a voltage magnitude of 1V in a first voltage domain and a logical value of 1 has a magnitude of 0.7V in a second voltage domain, then a level shifter acting on signals traveling from the first voltage domain to the second voltage domain would output 0.7V in response to receiving an input of 1V.

Figure 4:
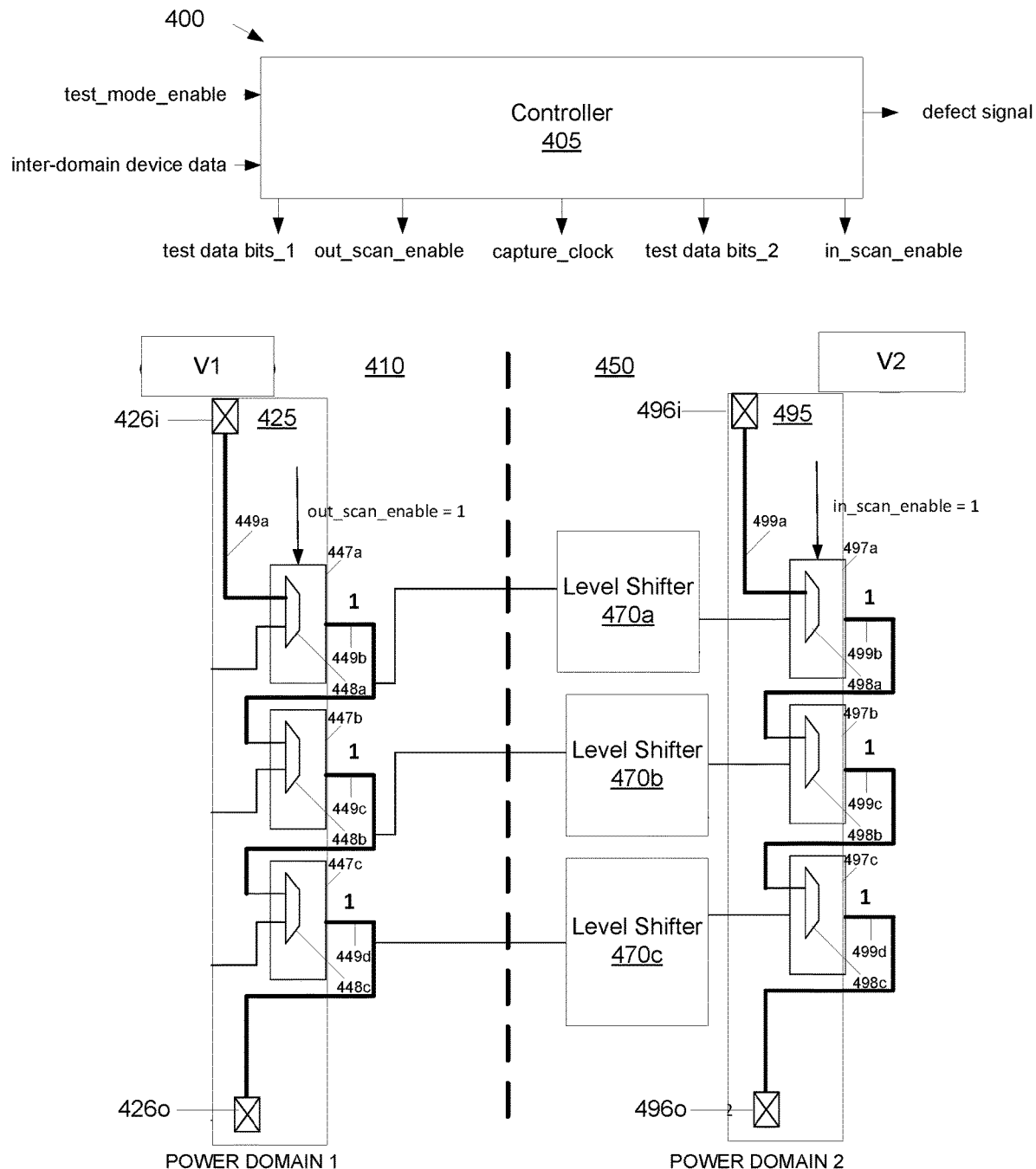
FIG. 4 illustrates an exemplary level shifter testing system in accordance with various aspects described.

FIG. 4 illustrates a simplified level shifter testing system 400 that is configured to test level shifters 470a-470c in a receiving module 450 that receives inter-domain signals from a module 410. Of course in practical application, thousands of level shifters would be tested by forming scan chains of thousands of wrapper devices (e.g., flops). The testing system 400 includes many of the same components as the testing system 100 and in FIG. 4 components are assigned reference characters having the same last two digits as their counterpart in FIG. 1. In FIG. 4, the supply voltage V1 for the module 410 is different than the supply voltage V2 of the receiving module 450, meaning that the modules are in different voltage domains. Level shifters 470 are used at each pin in the receiving module 450 that receives a signal from the module 410 to shift V1 to V2 prior to the signal being consumed by logic (not shown) in the receiving module 450.

The system 400 includes a controller 405 configured to control an input scan chain 425 and an output scan chain 495 as follows. The controller sets up supply voltages V1 and V2 to some desired values being tested. These values may be changed to characterize the functionality of the level shifters 470a-470c in different voltage domains. The controller provides first test data bits having logical values of 1 to the serial input 426i of the output scan chain 425. The controller may also provide second test data bits having some predetermined value (e.g., 0) to the serial input 496i of the input scan chain 495 so that the input wrapper devices have a known starting value. The controller then provides an output_scan_enable signal to the output wrapper chain 425 to shift the first test data bits into the output wrapper devices and optionally provides an input_scan_enable signal to the input scan chain 495 to shift the second test data bits into the input wrapper devices. The first test data bits will each then pass through a corresponding level shifter 470a-470c and arrive at the receiving module 450. The controller 405 captures the level shifter output data in the input wrapper devices by providing the capture clock signal to the input wrapper devices.

The controller provides the input_scan_enable signal to the input scan chain 495 to cause the level shifter output signals to be shifted out of the input scan chain serial output 496o. The level shifter device signals are compared against an expected voltage range (i.e., V2) to determine if the level shifters are functioning properly. If any of the level shifter signals are outside the expected voltage range, the controller provides a defect signal. In this manner a large number of level shifters may be tested in a small amount of time and the test can be part of the ATE test program. Note that the system 400 can be supported by any commercial ATPG tool for stimulus generation.

Figure 5A:
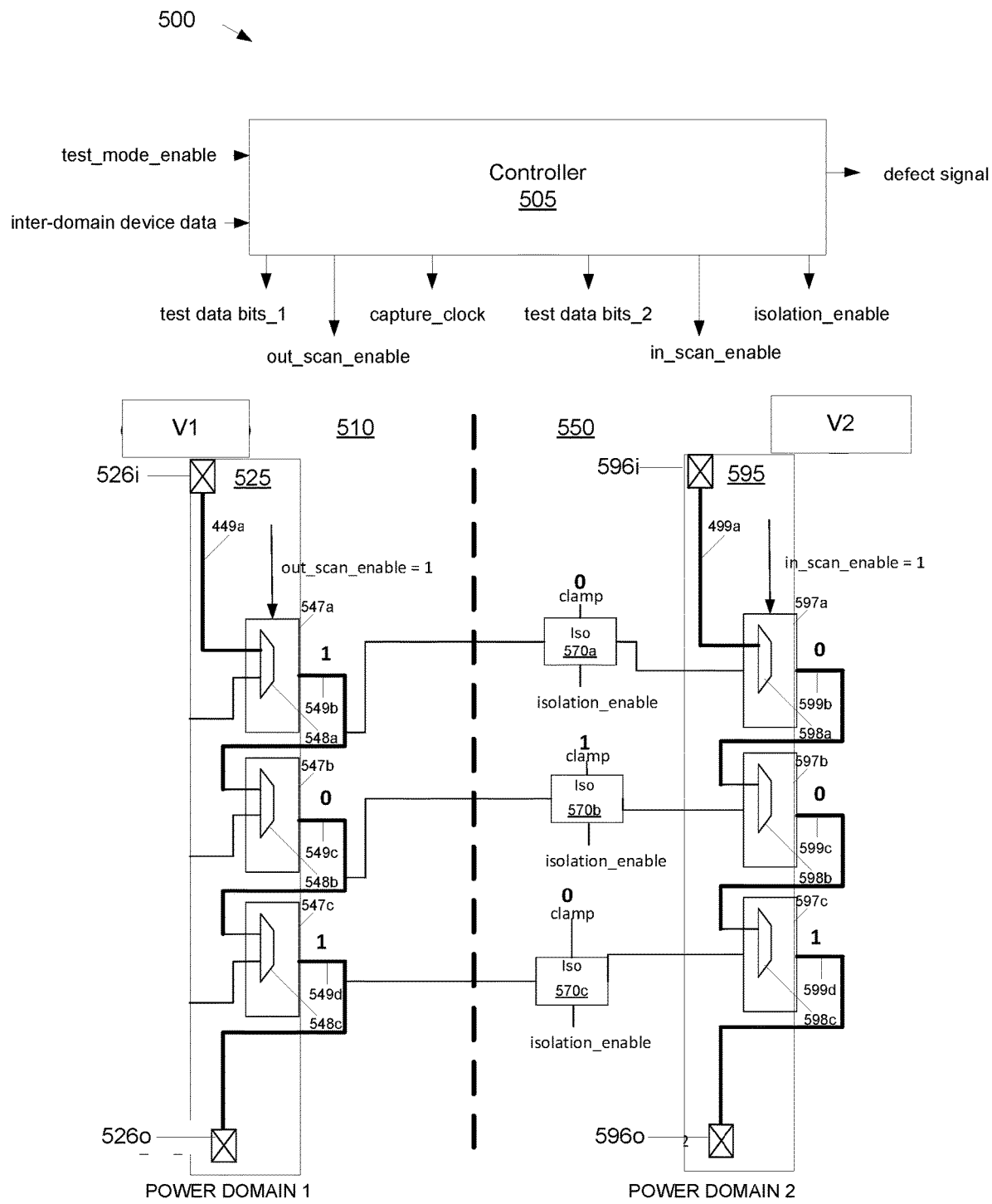
FIG. 5A-5C illustrate an exemplary isolation cell testing system in accordance with various aspects described.
Figure 5B:
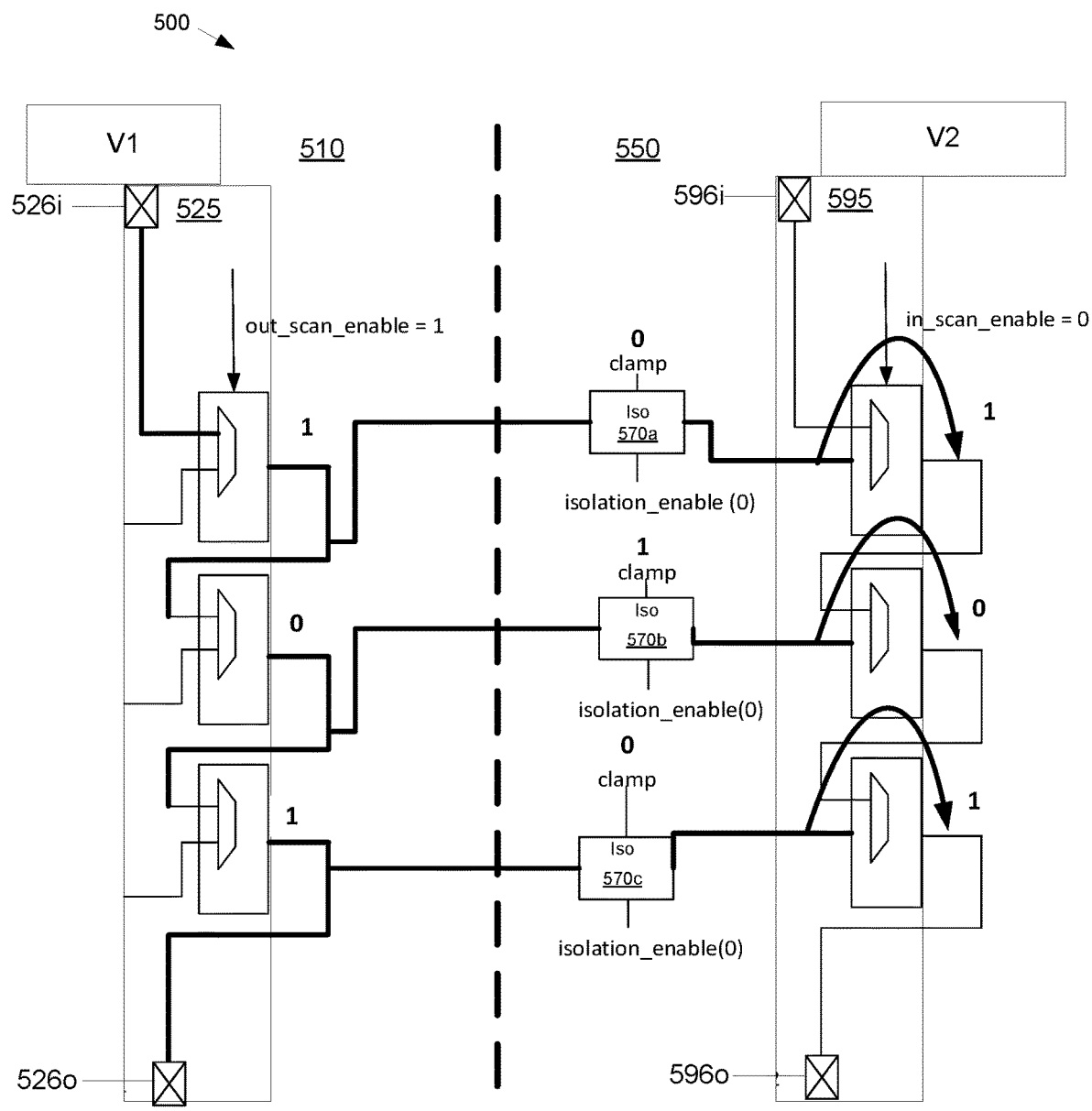
Figure 5C:
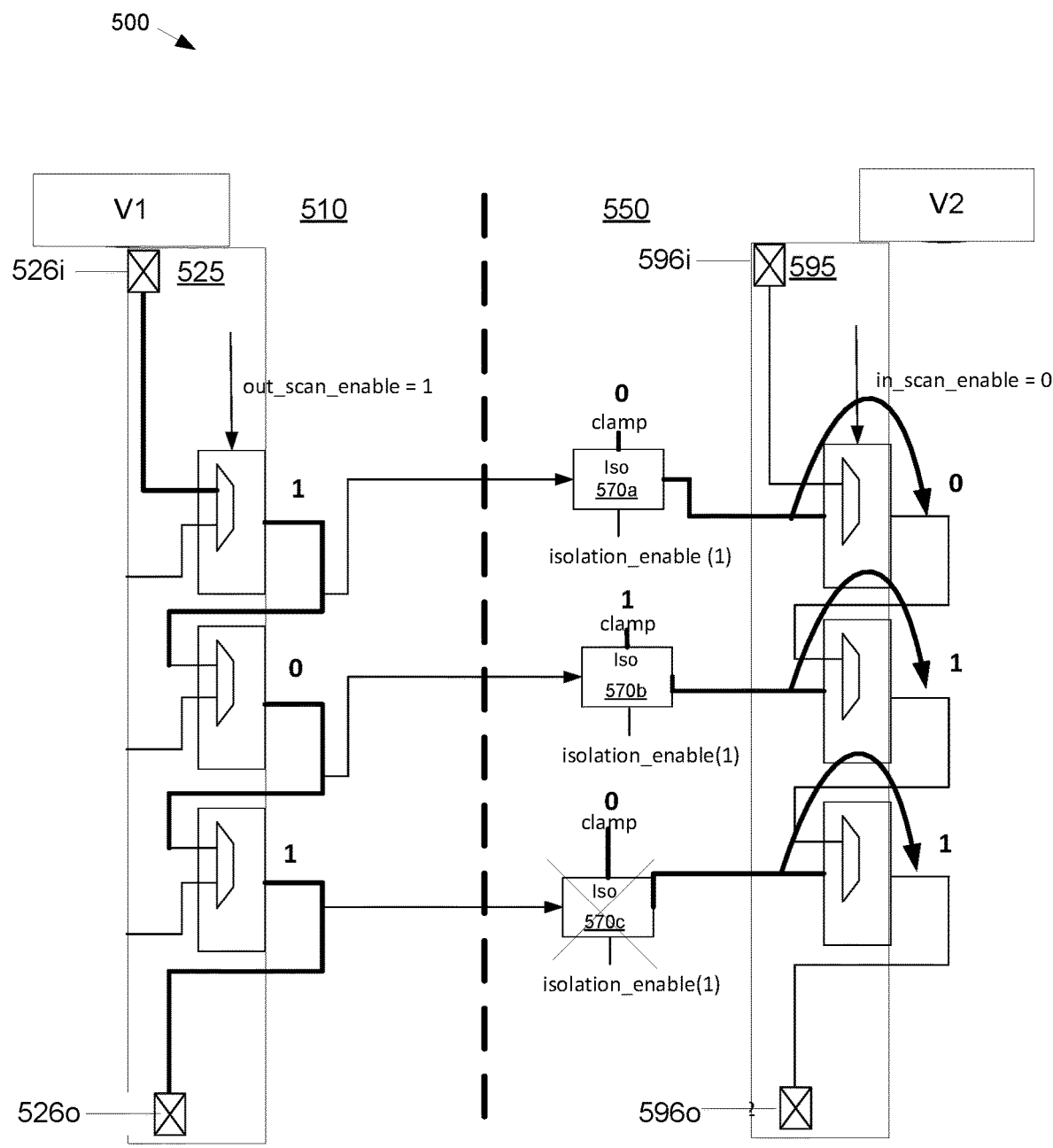

FIGS. 5A-5C illustrate an example isolation cell testing system 500 configured to test isolation cells 570a-570c. Of course in practical application, thousands of isolation cells would be tested by forming scan chains of thousands of wrapper devices (e.g., flip-flops or registers). The testing system 500 includes many of the same components as the testing system 100 and in FIG. 5 components are assigned reference characters having the same last two digits as their counterpart in FIG. 1. In FIG. 5, the supply voltage V1 for the module 410 is controlled differently than the supply voltage V2 of the receiving module 450, meaning that the modules are in different power domains. In at least one power mode, module 510 may be powered off while the receiving module 550 is powered on. Isolation cells 570 are used at each pin in the receiving module 550 that receives a signal from the module 510 to protect logic devices in the receiving module 550 from ambiguous or harmful signals received when the module 510 is powered OFF. When enabled, each isolation cell provides a fixed clamp value to the receiving module 550.

The system 500 includes a controller 505 configured to control an input scan chain 525 and an output scan chain 595 as follows. As shown in FIG. 5A, the controller provides first test data bits having, for example, logical values of 1 0 1 to the serial input 526i of the output scan chain 525. The controller may also provide second test data bits having some predetermined value (e.g., 1 0 1) to the serial input 596i of the input scan chain 595 so that the input wrapper devices have a known starting value. The controller then provides an output_scan_enable signal to the output wrapper chain 525 to shift the first test data bits into the output wrapper devices and optionally provides an input_scan_enable signal to the input scan chain 595 to shift the second test data bits into the input wrapper devices.

As shown in FIG. 5B the controller then removes the input_scan_enable signal from the input scan chain 595. In a first pass, the isolation_enable signal is set by the controller 505 to 0 so that the isolation cells are not enabled. The controller uses the capture clock to trigger the input wrapper devices to store the isolation cell output data values. The controller provides the input_scan_enable signal to the input scan chain 595 to cause the isolation cell output data to be shifted out of the input scan chain serial output 596o. The isolation cell output data are compared against the test data bits input to the output scan chain 595. If any of the isolation cell output data values do not match the corresponding test data bit, the controller provides a defect signal.

As shown in FIG. 5C, in a second pass, the isolation_enable signal is set to 1 so that the isolation cells are enabled. The controller uses the capture clock to trigger the input wrapper devices to store the isolation cell output data values. The controller provides the input_scan_enable signal to the input scan chain 595 to cause the isolation cell output data to be shifted out of the input scan chain serial output 596o. The isolation cell output data are compared against the clamp values for the corresponding isolation cells. If any of the isolation cell output data values do not match the corresponding clamp value, the controller provides a defect signal. In this manner a large number of isolation may be tested in a small amount of time and the test can be part of the ATE test program. Note that the system 500 can be supported by any commercial ATPG tool for stimulus generation.

Figure 6:
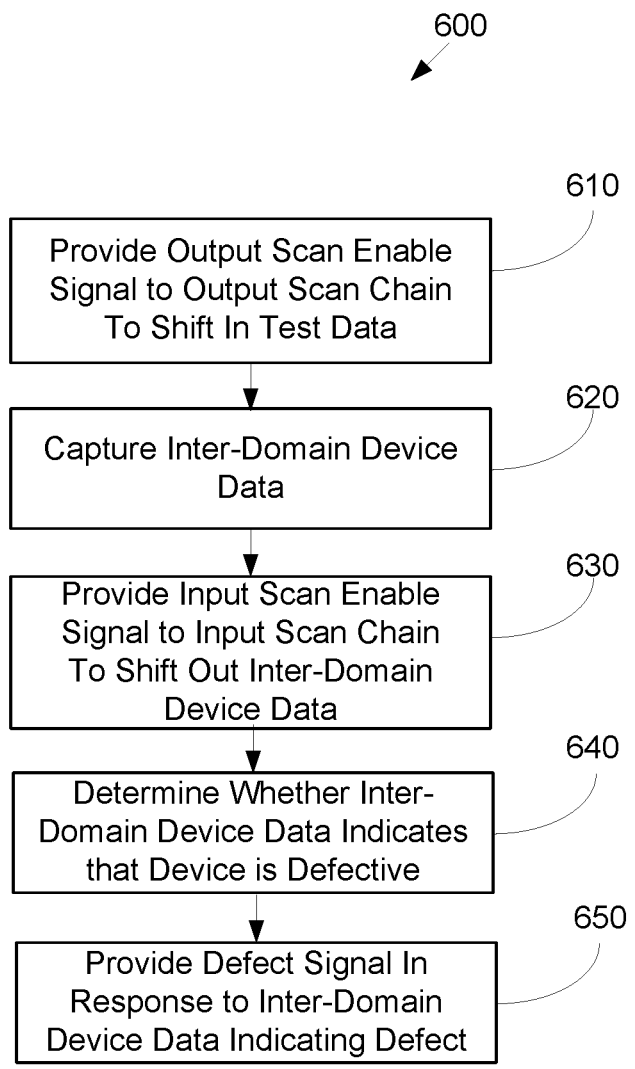
FIG. 6 illustrates an exemplary method for testing inter-domain devices in accordance with various aspects described.

FIG. 6 illustrates an example method 600 to tests an inter-domain device disposed between a first output wrapper device in a first module and a first input wrapper device in a second module. The method 600 may be performed, for example, by controllers 105, 405, and/or 505 of FIGS. 1, 4, and 5, respectively. The method includes, at 610, providing an output scan enable signal to an output scan chain to cause test data to be stored in the first output wrapper device. The method includes, at 620, capturing, with the first input wrapper device, inter-domain device data that is output by the inter-domain device. The method includes, at 630, providing an input scan enable signal to an input scan chain to cause the inter-domain device data to be output by an output scan chain serial output. The method includes, at 640, determining whether the inter-domain device data indicates that the inter-domain device is defective. The method includes, at 650, providing a defect signal in response to determining that the inter-domain device is defective.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for dynamically generating a clock signal for a data processing system according to embodiments and examples described herein.

Example 1 is a system configured to test an inter-domain device that is positioned in a signal path between a first output wrapper device in a first module and a first input wrapper device in a second module. The system includes an input scan chain, an output scan chain, and a controller. The output scan chain includes the first output wrapper device. The input scan chain includes the first input wrapper device. The controller is configured to provide an output scan enable signal to the output scan chain to cause test data to be stored in the first output wrapper device; capture, with the first input wrapper device, inter-domain device data that is output by the inter-domain device; provide an input scan enable signal to the input scan chain to cause the inter-domain device data to be output by an output scan chain serial output; determine whether the inter-domain device data indicates that the inter-domain device is defective; and provide a defect signal in response to determining that the inter-domain device is defective.

Example 2 includes the subject matter of example 1, including or omitting optional elements wherein the output scan chain includes the first output wrapper device and at least a second output wrapper device in the first module. The first output wrapper device is selectively serially connected to the second output wrapper device such that, in response to the output scan enable signal, data input to an output scan chain serial input shifts into the first output wrapper device and then into the second output wrapper device. The input scan chain includes the first input wrapper device and at least a second input wrapper device in the second module. The first input wrapper device is selectively serially connected to the second input wrapper device such that, in response to the input scan enable signal, data in the first input wrapper device shifts into the second input wrapper device and then out of the input scan chain serial output.

Example 3 includes the subject matter of example 1, including or omitting optional elements wherein one or both of the first output wrapper device and the first input wrapper device include a register.

Example 4 includes the subject matter of example 1, including or omitting optional elements wherein one or both of the first output wrapper device and the first input wrapper device include a flip-flop.

Example 5 includes the subject matter of example 1, including or omitting optional elements wherein the inter-domain device includes a level shifter and the controller is configured to determine a voltage magnitude of the inter-domain device data output by the input scan chain serial output and in response to the voltage magnitude falling outside of an expected range, provide a defect signal that indicates that the level shifter is defective.

Example 6 includes the subject matter of example 5, including or omitting optional elements wherein the test data includes a series of 1 data values.

Example 7 includes the subject matter of example 1, including or omitting optional elements wherein the inter-domain device includes an isolation cell and the controller is configured to provide an isolation enable signal to the isolation cell prior to capturing the inter-domain device data; determine whether the inter-domain device data corresponds to a clamp value for the isolation cell; and in response to determining that the inter-domain device data does not correspond to the clamp value, provide a defect signal that indicates that the isolation cell is defective.

Example 8 includes the subject matter of example 1, including or omitting optional elements wherein the first module and second module are in different power domains.

Example 9 is a method configured to test an inter-domain device that is positioned in a signal path between a first output wrapper device in a first module and a first input wrapper device in a second module. The method includes providing an output scan chain including the first output wrapper device; providing an input scan chain including the first input wrapper device; and providing an output scan enable signal to the output scan chain to cause test data to be stored in the first output wrapper device; capturing, with the first input wrapper device, inter-domain device data that is output by the inter-domain device; providing an input scan enable signal to the input scan chain to cause the inter-domain device data to be output by an output scan chain serial output; determining whether the inter-domain device data indicates that the inter-domain device is defective; and providing a defect signal in response to determining that the inter-domain device is defective.

Example 10 includes the subject matter of example 9, including or omitting optional elements, further including providing the output scan enable signal to the output scan chain to cause the test data to be shifted into the first output wrapper device and then into a second output wrapper device selectively serially connected to the first output wrapper device; and providing the input scan enable signal to the input scan chain to cause the inter-domain device data captured in the first input wrapper device to shift into a second input wrapper device selectively serially connected to the first input wrapper device and then out of the input scan chain serial output.

Example 11 includes the subject matter of example 9, including or omitting optional elements wherein one or both of the first output wrapper device and the first input wrapper device include a register.

Example 12 includes the subject matter of example 9, including or omitting optional elements wherein one or both of the first output wrapper device and the first input wrapper device include a flip-flop.

Example 13 includes the subject matter of example 9, including or omitting optional elements further including determining a voltage magnitude of the inter-domain device data output by the input scan chain serial output; and in response to the voltage magnitude falling outside of an expected range, provide a defect signal that indicates that the inter-domain device is defective.

Example 14 includes the subject matter of example 13, including or omitting optional elements further including causing test data including a series of 1 data values to be stored in the first output wrapper device.

Example 15 includes the subject matter of example 9, including or omitting optional elements further including providing an isolation enable signal to the inter-domain device prior to capturing the inter-domain device data; determining whether the inter-domain device data corresponds to a clamp value for the inter-domain device; and in response to determining that the inter-domain device data does not correspond to the clamp value, providing a defect signal that indicates that the inter-domain device is defective.

Example 16 includes the subject matter of example 9, including or omitting optional elements, wherein the first module and second module are in different power domains.

Example 17 is non-transitory computer-readable medium having computer-executable instructions stored thereon that, when executed by a processor cause the processor to perform corresponding functions. The functions include providing an output scan enable signal to an output scan chain to cause test data to be stored in a first output wrapper device; providing an input scan enable signal to the input scan chain to cause inter-domain device data to be output by an output scan chain serial output; determining whether the inter-domain device data indicates that the inter-domain device is defective; and providing a defect signal in response to determining that the inter-domain device is defective.

Example 18 includes the subject matter of example 17, including or omitting optional elements, further including instructions, that when executed by the processor cause the processor to determine a voltage magnitude of the inter-domain device data output by the input scan chain serial output; and in response to the voltage magnitude falling outside of an expected range, provide a defect signal that indicates that the inter-domain device is defective.

Example 19 includes the subject matter of example 18, including or omitting optional elements, further including instructions, that when executed by the processor cause the processor to cause test data including a series of 1 data values to be stored in the first output wrapper device.

Example 20 includes the subject matter of example 17, including or omitting optional elements, further including instructions, that when executed by the processor cause the processor to provide an isolation enable signal to the inter-domain device prior to capturing the inter-domain device data; determine whether the inter-domain device data corresponds to a clamp value for the inter-domain device; and in response to determining that the inter-domain device data does not correspond to the clamp value, provide a defect signal that indicates that the inter-domain device is defective.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer-readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A system configured to test an inter-domain device that is positioned in a signal path between a first output wrapper device in a first module and a first input wrapper device in a second module, the system comprising:
    an output scan chain comprising the first output wrapper device and at least a second output wrapper device in the first module;
    an input scan chain comprising the first input wrapper device; and
    a controller configured to:
        provide an output scan enable signal to the output scan chain to cause test data to be stored in the first output wrapper device;

capture, with the first input wrapper device, inter-domain device data that is output by the inter-domain device;

provide an input scan enable signal to the input scan chain to cause the inter-domain device data to be output by an output scan chain serial output;

determine whether the inter-domain device data indicates that the inter-domain device is defective; and provide a defect signal in response to determining that the inter-domain device is defective.

2. The system of claim 1, wherein:

wherein the first output wrapper device is selectively serially connected to the second output wrapper device such that, in response to the output scan enable signal, data input to an output scan chain serial input shifts into the first output wrapper device and then into the second output wrapper device; and the input scan chain comprises the first input wrapper device and at least a second input wrapper device in the second module, wherein the first input wrapper device is selectively serially connected to the second input wrapper device such that, in response to the input scan enable signal, data in the first input wrapper device shifts into the second input wrapper device and then out of the input scan chain serial output.

3. The system of claim 1, wherein one or both of the first output wrapper device and the first input wrapper device comprise a register.

4. The system of claim 1, wherein one or both of the first output wrapper device and the first input wrapper device comprise a flip-flop.

5. The system of claim 1, wherein:

the inter-domain device comprises a level shifter; and the controller is configured to:

determine a voltage magnitude of the inter-domain device data output by the input scan chain serial output; and in response to the voltage magnitude falling outside of an expected range, provide a defect signal that indicates that the level shifter is defective.

6. The system of claim 5, wherein the test data comprises a series of 1 data values.

7. The system of claim 1, wherein:

the inter-domain device comprises an isolation cell; and the controller is configured to:

provide an isolation enable signal to the isolation cell prior to capturing the inter-domain device data;

determine whether the inter-domain device data corresponds to a clamp value for the isolation cell; and in response to determining that the inter-domain device data does not correspond to the clamp value, provide a defect signal that indicates that the isolation cell is defective.

8. The system of claim 1, wherein the first module and second module are in different power domains.

9. A method configured to test an inter-domain device that is positioned in a signal path between a first output wrapper device in a first module and a first input wrapper device in a second module, the method comprising:

providing an output scan chain comprising the first output wrapper device;

providing an input scan chain comprising the first input wrapper device; and providing an output scan enable signal to the output scan chain to cause test data to be stored in the first output wrapper device;

capturing, with the first input wrapper device, inter-domain device data that is output by the inter-domain device;

providing an input scan enable signal to the input scan chain to cause the inter-domain device data to be output by an output scan chain serial output;

determining whether the inter-domain device data indicates that the inter-domain device is defective; and in response to a determination that the inter-domain device data does not correspond to a clamp value, providing a defect signal in response to determining that the inter-domain device is defective.

10. The method of claim 9, further comprising:

providing the output scan enable signal to the output scan chain to cause the test data to be shifted into the first output wrapper device and then into a second output wrapper device selectively serially connected to the first output wrapper device; and providing the input scan enable signal to the input scan chain to cause the inter-domain device data captured in the first input wrapper device to shift into a second input wrapper device selectively serially connected to the first input wrapper device and then out of the input scan chain serial output.

11. The method of claim 9, wherein one or both of the first output wrapper device and the first input wrapper device comprise a register.

12. The method of claim 9, wherein one or both of the first output wrapper device and the first input wrapper device comprise a flip-flop.

13. The method of claim 9, further comprising:

determining a voltage magnitude of the inter-domain device data output by the input scan chain serial output; and in response to the voltage magnitude falling outside of an expected range, provide a defect signal that indicates that the inter-domain device is defective.

14. The method of claim 13, further comprising causing test data comprising a series of 1 data values to be stored in the first output wrapper device.

15. The method of claim 9, further comprising:

providing an isolation enable signal to the inter-domain device prior to capturing the inter-domain device data; and determining whether the inter-domain device data corresponds to a clamp value for the inter-domain device.

16. The method of claim 9, wherein the first module and second module are in different power domains.

17. Non-transitory computer-readable medium having computer-executable instructions stored thereon that, when executed cause a system to perform corresponding functions, the functions comprising:

providing an output scan enable signal to an output scan chain to cause test data to be stored in a first output wrapper device;

providing an input scan enable signal to an input scan chain to cause inter-domain device data to be output by an output scan chain serial output, wherein the input scan chain comprises a first input wrapper device and at least a second input wrapper device;

determining whether the inter-domain device data indicates that the inter-domain device is defective; and providing a defect signal in response to determining that the inter-domain device is defective.

18. The non-transitory computer-readable medium of claim 17, further comprising instructions, that when executed cause the system to:

determine a voltage magnitude of the inter-domain device data output by the input scan chain serial output; and in response to the voltage magnitude falling outside of an expected range, provide a defect signal that indicates that the inter-domain device is defective.

19. The non-transitory computer-readable medium of claim 18, further comprising instructions, that when executed cause the system to cause test data comprising a series of 1 data values to be stored in the first output wrapper device.

20. The non-transitory computer-readable medium of claim 17, further comprising instructions, that when executed cause the system to:

provide an isolation enable signal to the inter-domain device prior to capturing the inter-domain device data;

determine whether the inter-domain device data corresponds to a clamp value for the inter-domain device; and in response to determining that the inter-domain device data does not correspond to the clamp value, provide a defect signal that indicates that the inter-domain device is defective.

\* \* \* \* \*